(12) United States Patent
Ghyselen (10) Patent No.: US 11,549,195 B2
(45) Date of Patent: Jan. 10, 2023

(54) METHOD FOR MANUFACTURING A MONOCRYSTALLINE LAYER OF GAAS MATERIAL AND SUBSTRATE FOR EPITAXTIAL GROWTH OF A MONOCRYSTALLINE LAYER OF GAAS MATERIAL

(71) Applicant: Soitec, Bernin (FR)

(72) Inventor: Bruno Ghyselen, Seyssinet (FR)

(73) Assignee: Soitec, Bernin (FR)

(*) Notice: Subject to any disclaimer, the term of this patent is extended or adjusted under 35 U.S.C. 154(b) by 0 days.

(21) Appl. No.: 17/042,699

(22) PCT Filed: Mar. 26, 2019

(86) PCT No.: PCT/IB2019/000207
§ 371 (c)(1),
(2) Date: Sep. 28, 2020

(87) PCT Pub. No.: WO2019/186268
PCT Pub. Date: Oct. 3, 2019

(65) Prior Publication Data
US 2021/0054528 A1      Feb. 25, 2021

(30) Foreign Application Priority Data

Mar. 28, 2018   (FR) ...................................... 1800252

(51) Int. Cl.
*C30B 29/32* (2006.01)
*C30B 23/02* (2006.01)
(Continued)

(52) U.S. Cl.
CPC ............ *C30B 29/32* (2013.01); *C30B 23/025* (2013.01); *C30B 25/183* (2013.01); *C30B 29/42* (2013.01);
(Continued)

(58) Field of Classification Search
CPC ..... C30B 29/32; C30B 23/025; C30B 25/183; C30B 29/42; H01L 21/76254;
(Continued)

(56) References Cited

U.S. PATENT DOCUMENTS

| 2002/0074624 A1* | 6/2002 | Ramdani | ........... H01L 21/02513 257/632 |
| 2003/0012965 A1* | 1/2003 | Droopad | ........... H01L 21/02381 257/E21.12 |
| 2004/0232525 A1* | 11/2004 | Ramdani | ............. H01L 27/0605 257/632 |
| 2011/0062446 A1* | 3/2011 | Goyal | ............... H01L 21/02463 257/E29.004 |

(Continued)

FOREIGN PATENT DOCUMENTS

CN         101981699 B      2/2013

OTHER PUBLICATIONS

Eisenbeiser et al, GaAs MESFETs Fabricated on Si Substrates Using a SrTioO 3 Buffer Layer, IFFF Electron Device Letters, vol. 23, No. 6, Jun. 1, 2002, pp. 300-302, (abstract only).
Fujioka et al., Epitaxial Growth of Semiconductors on SrTiO3 Substrates, Journal of Chrystal GR, vol. 229, No. 1-4, Jul. 1, 2001, pp. 137-141, (abstract only).

(Continued)

*Primary Examiner* — Robert M Kunemund
(74) *Attorney, Agent, or Firm* — TraskBritt (57) ABSTRACT

A process for producing a monocrystalline layer of GaAs material comprises the transfer of a monocrystalline seed layer of $SrTiO_3$ material to a carrier substrate of silicon material followed by epitaxial growth of a monocrystalline layer of GaAs material.

12 Claims, 5 Drawing Sheets

(51) Int. Cl.
  *C30B 25/18* (2006.01)
  *C30B 29/42* (2006.01)
  *H01L 21/02* (2006.01)
  *H01L 21/762* (2006.01)

(52) U.S. Cl.
  CPC .......... *H01L 21/02381* (2013.01); *H01L 21/02488* (2013.01); *H01L 21/02546* (2013.01); *H01L 21/02598* (2013.01); *H01L 21/02645* (2013.01); *H01L 21/76254* (2013.01)

(58) Field of Classification Search
  CPC ......... H01L 21/02645; H01L 21/02381; H01L 21/02488; H01L 21/02546; H01L 21/02598
  See application file for complete search history.

(56) References Cited

U.S. PATENT DOCUMENTS

2011/0171812 A1   7/2011   Letertre et al.
2015/0041853 A1   2/2015   Cheng et al.

OTHER PUBLICATIONS

International Search Report for International Application No. PCT/IB2019/000207 dated Jun. 4, 2019, 2 pages.
International Written Opinion for International Application No. PCT/IB2019/000207 dated Jun. 4, 2019, 4 pages.
Singapore Written Opinion from Singapore Application No. 11202009529W, dated Oct. 21, 2021, 6 pages.
Yu et al., GaAs-Based Heterostructures on Silicon, 2002 GaAsMantech Conference, https://www.researchgate.net/publication/266451398_GaAs-Based_Heterostructures_on_Silicon, (2002), 5 pages.

* cited by examiner

METHOD FOR MANUFACTURING A MONOCRYSTALLINE LAYER OF GAAS MATERIAL AND SUBSTRATE FOR EPITAXTIAL GROWTH OF A MONOCRYSTALLINE LAYER OF GAAS MATERIAL

CROSS-REFERENCE TO RELATED APPLICATIONS

This application is a national phase entry under 35 U.S.C. § 371 of International Patent Application PCT/IB2019/000207, filed Mar. 26, 2019, designating the United States of America and published as International Patent Publication WO 2019/186268 A1 on Oct. 3, 2019, which claims the benefit under Article 8 of the Patent Cooperation Treaty to French Patent Application Serial No. 1800252, filed Mar. 28, 2018.

TECHNICAL FIELD

The present disclosure relates to a process for producing a monocrystalline layer of GaAs material and a substrate for the epitaxial growth of such a monocrystalline layer of GaAs material.

BACKGROUND

Certain materials are not currently available as a monocrystalline substrate in the form of a large-diameter wafer. Moreover, certain materials may be available in large diameter but not with certain characteristics or specifications in terms of quality, in particular, with regard to the density of defects or the required electrical or optical properties.

BRIEF SUMMARY

The present disclosure aims to overcome these limitations of the prior art by providing a process for producing a monocrystalline layer of GaAs material and a substrate for the epitaxial growth of such a monocrystalline layer of GaAs material. In this way it is possible to address the problem of size of the monocrystalline substrates of GaAs material currently available.

The present disclosure relates to a process for producing a monocrystalline layer of GaAs material comprising the transfer of a monocrystalline seed layer of $SrTiO_3$ material to a carrier substrate of silicon material followed by epitaxial growth of a monocrystalline layer of GaAs material.

In advantageous embodiments, the monocrystalline seed layer has a thickness of less than 10 μm, preferably less than 2 μm, and more preferably less than 0.2 μm.

In advantageous embodiments, the transfer of the monocrystalline seed layer of $SrTiO_3$ material to the carrier substrate of silicon material comprises a step of joining a monocrystalline substrate of $SrTiO_3$ material to the carrier substrate followed by a step of thinning of the monocrystalline substrate of $SrTiO_3$ material.

In advantageous embodiments, the thinning step comprises the formation of a weakened zone delimiting a portion of the monocrystalline substrate of $SrTiO_3$ material intended to be transferred to the carrier substrate of silicon material.

In advantageous embodiments, the formation of the weakened zone is obtained by implanting atomic and/or ionic species.

In advantageous embodiments, the thinning step comprises detaching at the weakened zone so as to transfer the portion of the monocrystalline substrate of $SrTiO_3$ material to the carrier substrate of silicon material, in particular, the detaching comprises the application of thermal and/or mechanical stress.

In advantageous embodiments, the joining step is a molecular adhesion step.

In advantageous embodiments, the monocrystalline seed layer of $SrTiO_3$ material is in the form of a plurality of tiles each transferred to the carrier substrate of silicon material.

In advantageous embodiments, the carrier substrate of silicon material comprises a detachable interface configured to be detached by means of chemical attack and/or by means of mechanical stress.

The present disclosure also relates to a substrate for epitaxial growth of a monocrystalline layer of GaAs material, wherein the substrate comprises a monocrystalline seed layer of $SrTiO_3$ material on a carrier substrate of silicon material.

In advantageous embodiments, the monocrystalline seed layer of $SrTiO_3$ material is in the form of a plurality of tiles.

In advantageous embodiments, the carrier substrate of silicon material comprises a detachable interface configured to be detached by means of chemical attack and/or by means of mechanical stress.

The present disclosure also relates to a process for producing a monocrystalline layer of $Al_xIn_yGa_zAs_tP_mN_n$ material having a lattice parameter close to that of the GaAs material comprising the transfer of a monocrystalline seed layer of $SrTiO_3$ material to a carrier substrate of silicon material followed by epitaxial growth of a monocrystalline layer of $Al_xIn_yGa_zAs_tP_mN_n$ material.

The present disclosure also relates to a process for producing a monocrystalline layer of $Al_xIn_yGa_zAs_tP_mN_n$ material having a lattice parameter close to that of the GaAs material comprising the transfer of a monocrystalline seed layer of YSZ or $CeO_2$ or MgO or $Al_2O_3$ material, to a carrier substrate of silicon material followed by epitaxial growth of a monocrystalline layer of $Al_xIn_yGa_zAs_tP_mN_n$ material.

The present disclosure also relates to a substrate for epitaxial growth of a monocrystalline layer of $Al_xIn_yGa_zAs_tP_mN_n$ material having a lattice parameter close to that of the GaAs material, wherein it comprises a monocrystalline seed layer of $SrTiO_3$ or YSZ or $CeO_2$ or MgO or $Al_2O_3$ material on a carrier substrate of silicon material.

BRIEF DESCRIPTION OF THE DRAWINGS

Other features and advantages of the present disclosure will be better understood from reading the following detailed description with reference to the appended drawings, in which.

To improve the readability of the figures, the various layers are not necessarily shown to scale.

DETAILED DESCRIPTION

Figure 1:
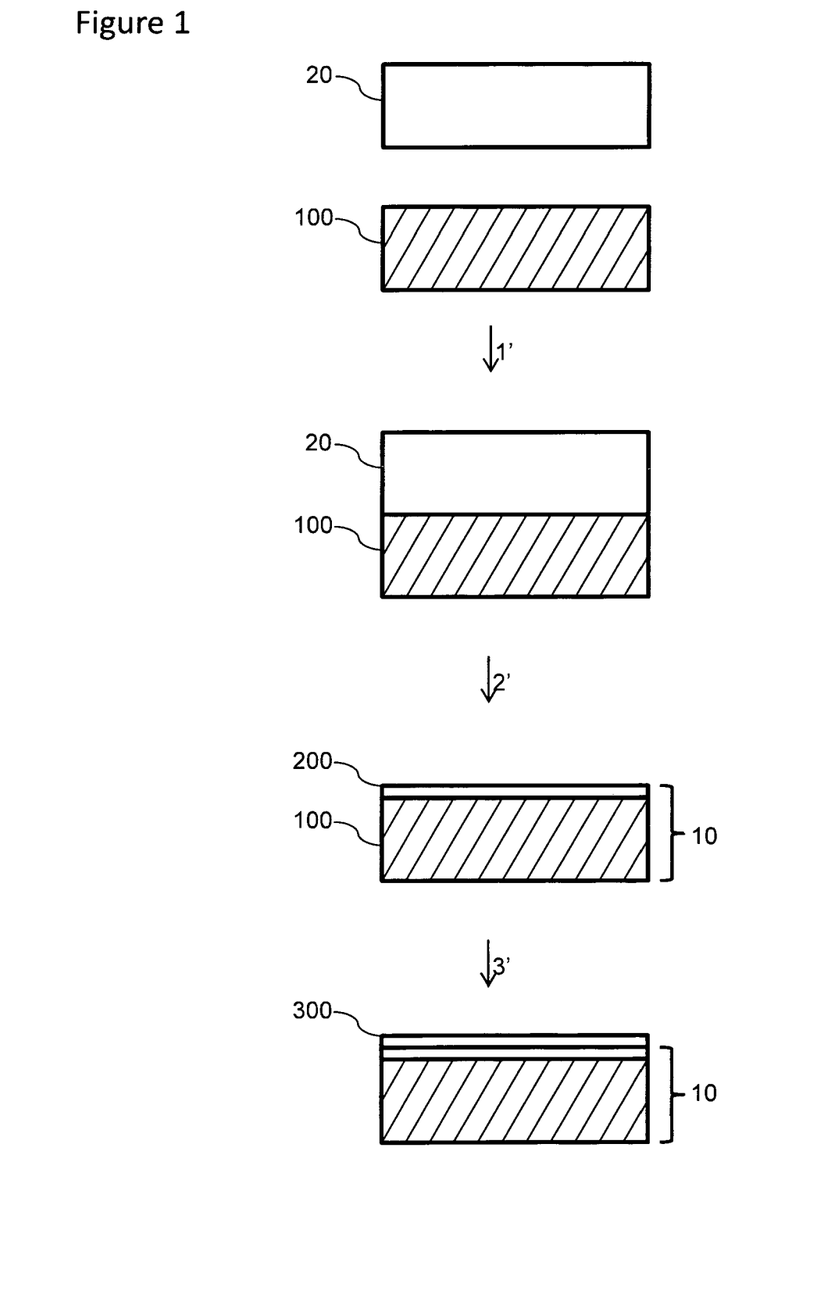
FIG. 1 illustrates a process for producing a monocrystalline layer of GaAs material according to one embodiment of the present disclosure and a substrate for the epitaxial growth of such a monocrystalline layer of GaAs material according to this embodiment of the present disclosure.

FIG. 1 illustrates a carrier substrate 100 of silicon material to which a monocrystalline seed layer 200 of $SrTiO_3$ material is transferred. Other materials for the monocrystalline seed layer 200 may be envisaged such as YSZ, $CeO_2$, MgO or $Al_2O_3$, these having a lattice parameter close to that of the GaAs material. The carrier substrate 100 of silicon material may also be replaced with a carrier substrate 100 of sapphire, Ni or Cu material. The use of silicon has the advantage of opening up the field of application of films of GaAs material not only for 300 mm-type large-scale equipment, but also making it compatible with the microelectronics industry, for which the requirements in terms of acceptance on the production line for exotic material other than silicon, especially GaAs, are high. The step of joining 1' the monocrystalline seed layer 200 of $SrTiO_3$ material to the carrier substrate 100 of silicon material is preferably carried out by way of a molecular adhesion step. This molecular adhesion step comprises a bonding step, preferably at ambient temperature, and is followed by an anneal for consolidating the bonding interface, which is usually carried out at high temperatures of up to 900° C. or even 1100° C. for a duration of a few minutes to a few hours.

FIG. 1 schematically shows the step of joining 1' a monocrystalline substrate 20 of $SrTiO_3$ material to the carrier substrate 100 of silicon material. It follows a step of thinning 2' the monocrystalline substrate 20 of $SrTiO_3$ material after having been joined to the carrier substrate 100 of silicon material. FIG. 1 schematically shows the thinning step 2', which may be implemented, for example, by means of chemical and/or mechanical etching (polishing, grinding, milling, etc.). Thus, the monocrystalline seed layer 200 of $SrTiO_3$ material may be obtained, which will serve as the monocrystalline seed for a step of epitaxially growing 3' the monocrystalline layer 300 of GaAs material on the substrate for epitaxial growth of a monocrystalline layer of GaAs material 10 shown schematically in FIG. 1. Those skilled in the art would be capable of adjusting the parameters used for epitaxially growing the monocrystalline layer of GaAs material usually used in homoepitaxy or heteroepitaxy on a bulk monocrystalline substrate in order to optimize the step of epitaxially growing 3' the monocrystalline layer 300 of GaAs material on the substrate for epitaxial growth of a monocrystalline layer of GaAs material 10 of the present disclosure. Epitaxy of the GaAs material therefore takes place by way of MOCVD or MBE at typical temperatures of between 550 and 700° C. using precursors known to those skilled in the art. Incidentally, the present disclosure is not limited to epitaxy of the GaAs material but extends to certain composites of $Al_xIn_yGa_zAs_jP_mN_n$ type having a lattice parameter close to that of the GaAs material.

Figure 2:
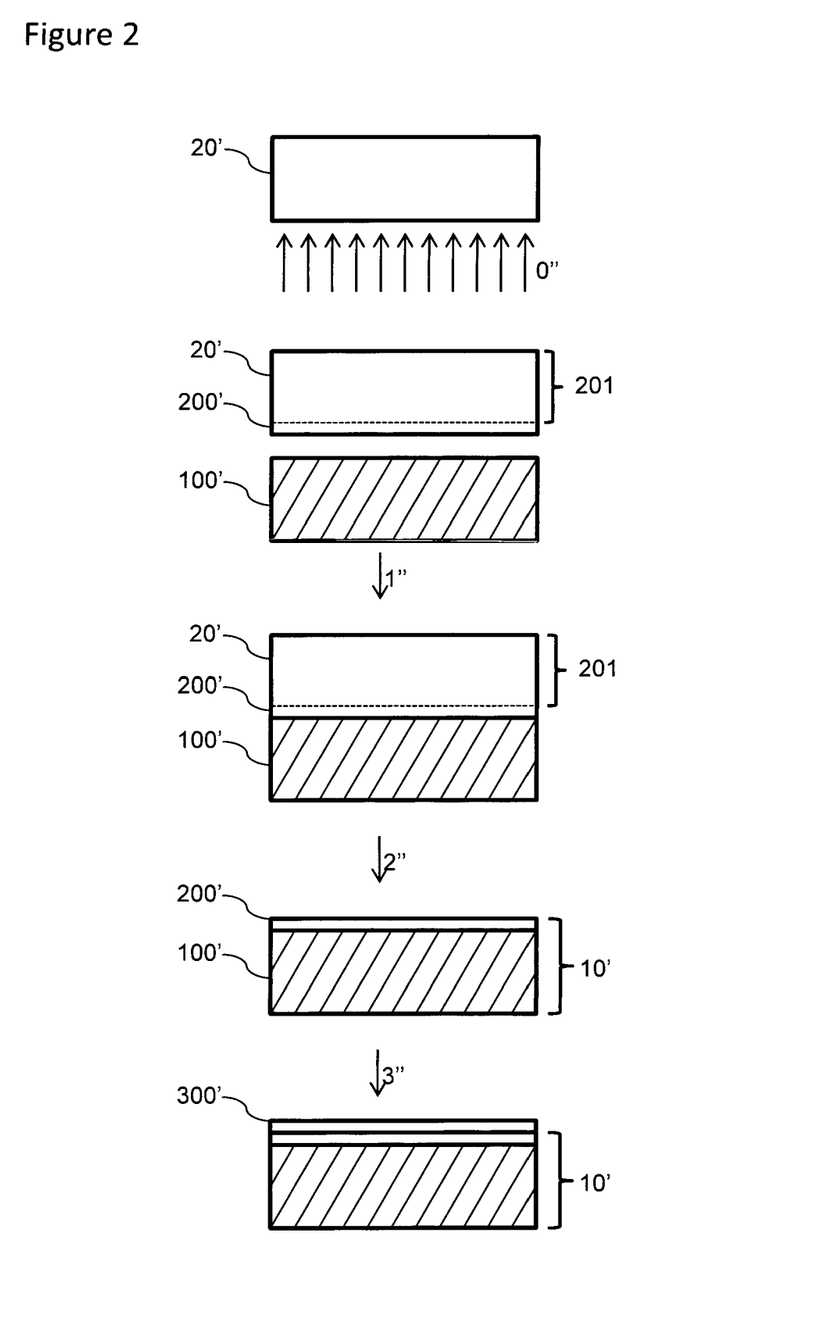
FIG. 2 illustrates a process for producing a monocrystalline layer of GaAs material according to another embodiment of the present disclosure and a substrate for the epitaxial growth of such a monocrystalline layer of GaAs material according to this other embodiment of the present disclosure.

FIG. 2 schematically shows one embodiment of the process for producing a monocrystalline layer of GaAs material, which differs from the embodiment described in conjunction with FIG. 1 in that the monocrystalline substrate 20' of $SrTiO_3$ material undergoes a step of implanting 0" atomic and/or ionic species in order to form a weakened zone delimiting a portion 200' of the monocrystalline substrate 20' of $SrTiO_3$ material intended to be transferred to the carrier substrate 100' of silicon material, and in that the thinning step 2" comprises detaching at this weakened zone so as to transfer the portion 200' of the monocrystalline substrate 20' of $SrTiO_3$ material to the carrier substrate 100' of silicon material, in particular, this detaching comprises the application of a thermal and/or mechanical stress. The advantage of this embodiment is thus to be able to recover the remaining part 201 of the starting monocrystalline substrate 20' of $SrTiO_3$ material, which may thus be used again to undergo the same process again and thus decrease costs. The substrate for epitaxial growth of a monocrystalline layer of GaAs material 10' thus illustrated in FIG. 2 is used for the step of growing 3" the monocrystalline layer 300' of GaAs material as already described in the process described in conjunction with FIG. 1. In general, the implantation step 0" takes place using hydrogen ions. One advantageous alternative well known to those skilled in the art consists in replacing all or some of the hydrogen ions with helium ions. A hydrogen implantation dose will typically be between $6 \times 10^{16}$ $cm^{-2}$ and $1 \times 10^{17}$ $cm^{-2}$. The implantation energy will typically be between 50 to 170 keV. Thus, the detaching typically takes place at temperatures of between 300 and 600° C. Thicknesses of the monocrystalline seed layer of the order of 200 nm to 1.5 µm are thus obtained. Immediately after the detaching operation, additional technological steps are advantageously added with the aim of either strengthening the bonding interface or of restoring a good level of roughness, or of correcting any defects, which may have been be generated in the implantation step or else to prepare the surface of the seed layer for the resumption of epitaxy. These steps are, for example, polishing, (wet or dry) chemical etching, annealing, chemical cleaning. They may be used alone or in a combination, which those skilled in the art will be capable of adjusting.

Figure 3:
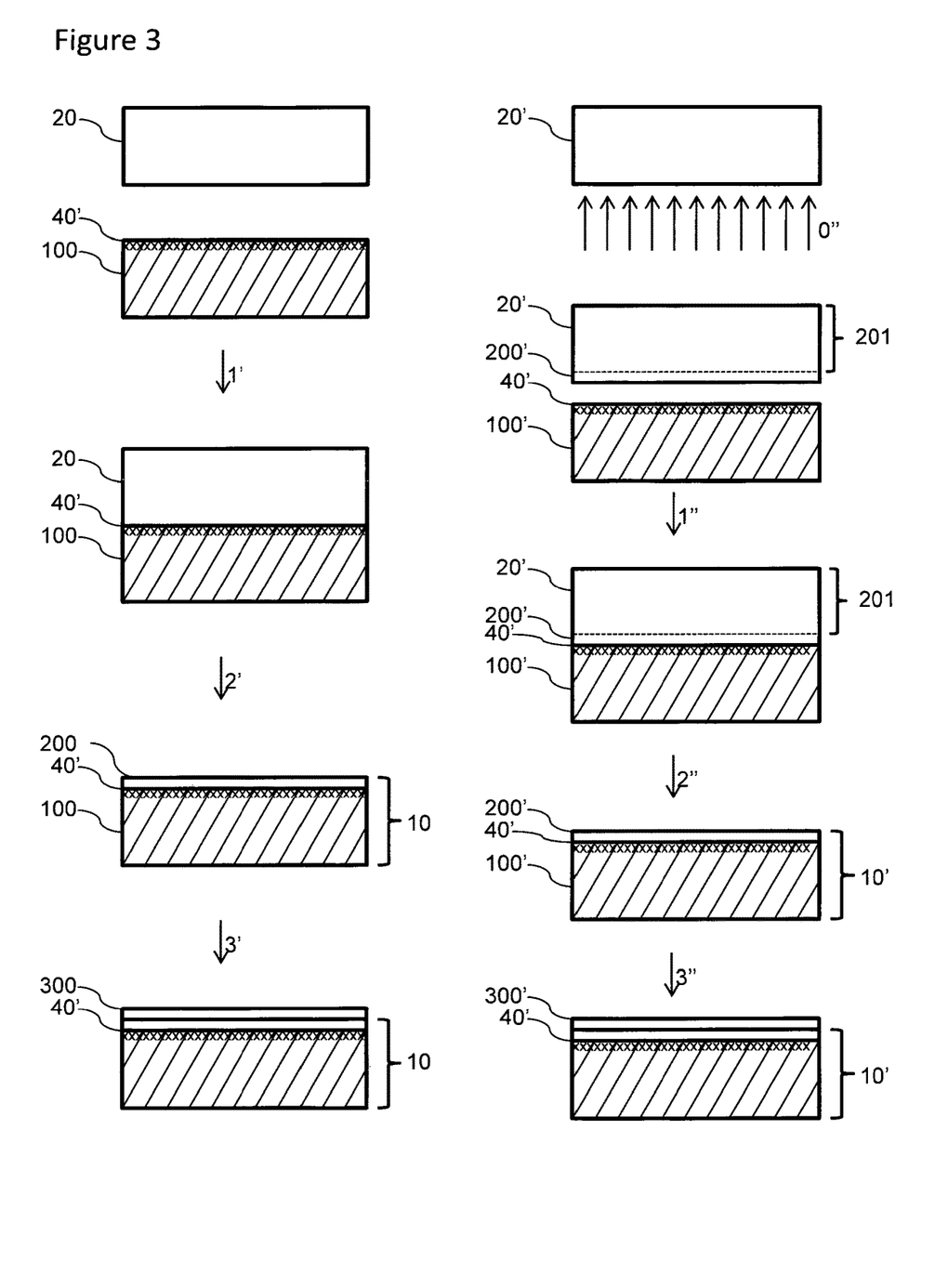
FIG. 3 illustrates a process for producing a monocrystalline layer of GaAs material according to yet another embodiment of the present disclosure and a substrate for the epitaxial growth of such a monocrystalline layer of GaAs material according to this other embodiment of the present disclosure.

FIG. 3 differs from the embodiments described in conjunction with FIGS. 1 and 2 in that the substrate for epitaxial growth of a monocrystalline layer of GaAs material (10, 10') comprises a detachable interface 40' that is configured to be detached. In the case of a carrier substrate 100 of silicon material, it may be a rough surface, for example, of silicon material, joined with the monocrystalline seed layer during the joining step. Else, a rough interface may be present within the carrier substrate 100 of silicon material, the latter, for example, obtained by joining two silicon wafers. Another embodiment would be to introduce, at the face to be joined with the monocrystalline seed layer, a porous silicon layer that is liable to split during the application of a mechanical and/or thermal stress, for example, by inserting a blade at the edge of the wafer known to those skilled in the art or by applying an anneal. Obviously, this interface is chosen so as to withstand the other mechanical and/or thermal stresses experienced during the process of the present disclosure (e.g., detaching, epitaxial growth, etc.). Those skilled in the art will be capable of identifying other processes for producing this detachable interface. These various detaching configurations thus make it possible either to transfer the epitaxial layer to a final carrier, which is not compatible with the growth parameters or to prepare a thick film of GaAs material of freestanding type.

Figure 4:
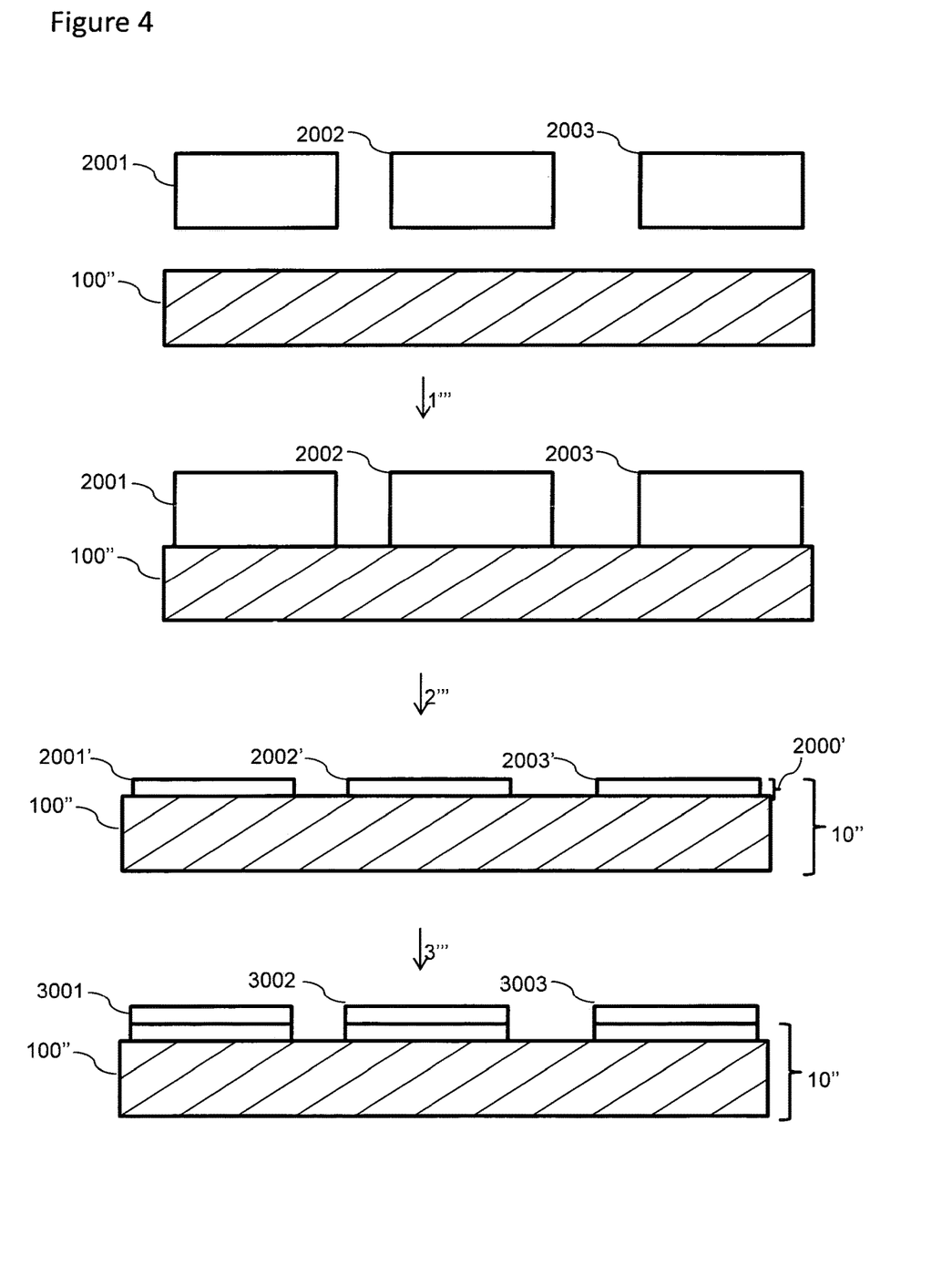
FIG. 4 illustrates a process for producing a monocrystalline layer of GaAs material according to yet another embodiment of the present disclosure and a substrate for the epitaxial growth of such a monocrystalline layer of GaAs material according to this other embodiment of the present disclosure.

FIG. 4 schematically shows one embodiment of the process for producing a monocrystalline layer of GaAs material, which differs from the embodiments described in conjunction with FIGS. 1-3 in that the monocrystalline seed layer 2000' of $SrTiO_3$ material is in the form of a plurality of tiles (2001', 2002', 2003') each transferred to the carrier substrate 100" of silicon material. The various tiles may take any shape (square, hexagonal, strips, etc.) and have different sizes varying from a few $mm^2$ to several $cm^2$. The spacing between the chips may also vary significantly depending on whether what is sought is a maximum density of coverage (in this case a spacing of less than 0.2 mm will preferably be chosen) or conversely a maximum spread of the tiles within the substrate (in this case the spacing may be several millimeters and even centimeters). For each tile, a person skilled in the art would be capable of applying their desired transfer and they are not limited to a particular process. Thus, it is possible to envisage applying the technical teachings described in conjunction with the process illustrated schematically in FIG. 1 or the technical teachings described in conjunction with the process illustrated schematically in FIG. 2, or even a combination of the two. Thus, it is possible to join 1''' monocrystalline substrates (2001, 2002, 2003) of $SrTiO_3$ material, which have a size smaller than the size of the carrier substrate 100" in order to create by thinning 2''' on this latter the monocrystalline seed layers (2001', 2002', 2003') for the epitaxial growth 3''' of a monocrystalline layer (3001, 3002, 3003) of GaAs material on each tile of the substrate for epitaxial growth of a monocrystalline layer of GaAs material 10".

The various embodiments described in conjunction with FIGS. 1 to 4 thus open up the possibility of co-integration of components made in the monocrystalline layer of GaAs material with components made in the carrier substrate of silicon material. This latter may simply be a silicon substrate, but it may also be an SOI-type substrate comprising a silicon oxide layer separating a silicon substrate from a thin silicon layer. In the case of the embodiments described in conjunction with FIGS. 1 to 4, access to the carrier substrate may be achieved simply by way of lithography and etching known to those skilled in the art. In the case of the embodiment described in conjunction with FIG. 4, it is also possible just to choose the locations of the tiles and their spacing.

Figure 5:
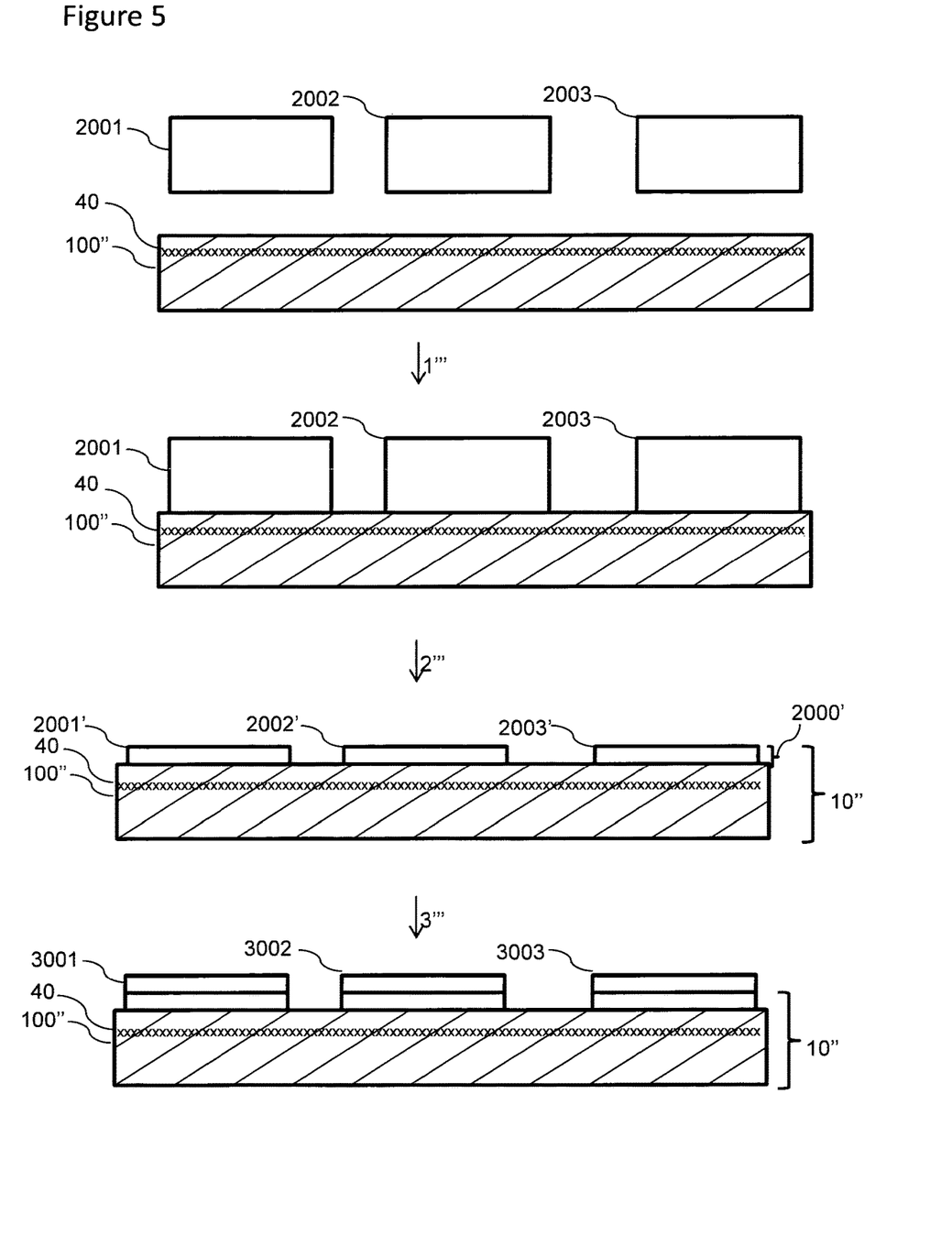
FIG. 5 illustrates a process for producing a monocrystalline layer of GaAs material according to yet another embodiment of the present disclosure and a substrate for the epitaxial growth of such a monocrystalline layer of GaAs material according to this other embodiment of the present disclosure.

FIG. 5 schematically shows one embodiment, which differs from the embodiment described in conjunction with FIG. 4 in that the carrier substrate 100" and subsequently the substrate for epitaxial growth of the monocrystalline layer of GaAs material 10" comprises a detachable interface 40 that is configured to be detached, for example, by means of chemical attack and/or by means of mechanical stress. This would allow part of the carrier substrate 100" to be removed as already mentioned in conjunction with FIG. 3. One example would be the use of a carrier substrate 100 of SOI type comprising a silicon oxide layer separating a silicon substrate from a thin silicon layer. This oxide layer could be used as a detachable interface 40 by selective etching this oxide layer, for example, by immersion in a hydrofluoric (HF) acid bath. This option of detaching a buried layer by means of chemical etch is particularly advantageous when it is in combination with treating a plurality of small substrates. Specifically, the range of under-etches is generally limited to a few centimeters or even a few millimeters if it is desired to retain industrially reasonable treatment conditions and times. Treating a plurality of small substrates allows the initiation of several chemical etching fronts by virtue of possible access to the buried layer between each tile, rather than just at the extreme edges of the substrates, which may be up to 300 mm in diameter. In the case of an SOI-type carrier substrate, it is thus possible to partially remove the thin layer of silicon between the tiles in order to allow the initiation of several etching fronts.

Since the thin layer of silicon has a predetermined thickness (which may vary between 5 nm to 600 nm, or even thicker depending on the intended application), it could thus be used to form microelectronic components and thus allow the co-integration of components based on GaAs materials in a single substrate.

Thus, after having formed the monocrystalline layer (3001, 3002, 3003) by epitaxy, it is also possible to conceive joining this structure to a final substrate and detaching, at the detachable interface 40, a part of the carrier substrate 100". The final substrate may thus provide additional functionalities, which are, for example, incompatible with parameters of the growth carried out previously (for example, final substrate of flexible plastic type or final substrate comprising metal lines). Additionally and in general, the detachable interface is not necessarily located inside the carrier substrate but may also be located at the interface with the seed layer of $SrTiO_3$ material joined to this carrier substrate as already described in conjunction with FIG. 3.

The invention claimed is:

1. A process for producing a monocrystalline layer of GaAs material, comprising:
   transferring a monocrystalline seed layer of $SrTiO_3$ material to a carrier substrate of silicon material, followed by epitaxial growth of the monocrystalline layer of GaAs material;
   wherein the monocrystalline seed layer has a thickness of less than 10 µm; and
   wherein the transfer of the monocrystalline seed layer of $SrTiO_3$ material to the carrier substrate of silicon material comprises joining a monocrystalline substrate of $SrTiO_3$ material to the carrier substrate, followed by thinning the monocrystalline substrate of $SrTiO_3$ material.

2. The process of claim 1, wherein the thinning of the monocrystalline substrate of $SrTiO_3$ material comprises forming a weakened zone delimiting a portion of the monocrystalline substrate of $SrTiO_3$ material to be transferred to the carrier substrate of silicon material.

3. The process of claim 2, wherein the formation of the weakened zone comprises implanting atomic and/or ionic species into the monocrystalline substrate of $SrTiO_3$ material.

4. The process of claim 2, wherein the thinning of the monocrystalline substrate of $SrTiO_3$ material comprises detaching at the weakened zone so as to transfer the portion of the monocrystalline substrate of $SrTiO_3$ material to the carrier substrate of silicon material.

5. The process of claim 1, wherein the joining of the monocrystalline substrate of $SrTiO_3$ material to the carrier substrate comprises molecular adhesion of the monocrystalline substrate of $SrTiO_3$ material to the carrier substrate.

6. A process for producing a monocrystalline layer of GaAs material, comprising: transferring a monocrystalline seed layer of $SrTiO_3$ material to a carrier substrate of silicon material, followed by epitaxial growth of the monocrystalline layer of GaAs material, wherein the monocrystalline seed layer of $SrTiO_3$ material is in a form of a plurality of tiles each transferred to the carrier substrate of silicon material.

7. A process for producing a monocrystalline layer of GaAs material, comprising: transferring a monocrystalline seed layer of $SrTiO_3$ material to a carrier substrate of silicon material, followed by epitaxial growth of the monocrystalline layer of GaAs material, wherein the carrier substrate of silicon material comprises a detachable interface configured to be detached by chemical attack and/or by mechanical stress.

8. A substrate for epitaxial growth of a monocrystalline layer of GaAs material, comprising: a monocrystalline seed layer of $SrTiO_3$ material on a carrier substrate of silicon material, wherein the carrier substrate of silicon material includes a detachable interface configured to be detached by means of chemical attack and/or by means of mechanical stress.

9. The substrate of claim 8, wherein the monocrystalline seed layer of $SrTiO_3$ material is present in the form of a plurality of tiles.

10. The process of claim 1, wherein the monocrystalline seed layer has a thickness of less than 2 μm.

11. The process of claim 10, wherein the monocrystalline seed layer has a thickness of less than 0.2 μm.

12. The process of claim 4, wherein the detaching comprises an application of a thermal and/or mechanical stress to the monocrystalline substrate of $SrTiO_3$ material.

\* \* \* \* \*